(12) United States Patent
Bando

(10) Patent No.: US 10,847,687 B2
(45) Date of Patent: Nov. 24, 2020

(54) LIGHT-EMITTING DEVICE AND METHOD OF MANUFACTURING THE SAME

(71) Applicant: NICHIA CORPORATION, Anan (JP)

(72) Inventor: Atsushi Bando, Anan (JP)

(73) Assignee: NICHIA CORPORATION, Anan (JP)

( * ) Notice: Subject to any disclaimer, the term of this patent is extended or adjusted under 35 U.S.C. 154(b) by 0 days.

(21) Appl. No.: 16/427,196

(22) Filed: May 30, 2019

(65) Prior Publication Data

US 2019/0371981 A1    Dec. 5, 2019

(30) Foreign Application Priority Data

Jun. 1, 2018 (JP) ................. 2018-105745

(51) Int. Cl.
  *H01L 33/50* (2010.01)
  *H01L 33/00* (2010.01)
  *H01L 33/56* (2010.01)

(52) U.S. Cl.
  CPC .......... *H01L 33/507* (2013.01); *H01L 33/005* (2013.01); *H01L 33/56* (2013.01); *H01L 2933/0091* (2013.01)

(58) Field of Classification Search
  CPC .... H01L 33/504; H01L 33/507; H01L 33/005
  See application file for complete search history.

(56) References Cited

U.S. PATENT DOCUMENTS

| 2007/0012940 A1 | 1/2007 | Suh et al. |
| 2007/0182323 A1 | 8/2007 | Ogata et al. |
| 2008/0211386 A1 * | 9/2008 | Choi ............... H01L 33/504 313/503 |
| 2010/0264448 A1 | 10/2010 | Choi et al. |
| 2011/0248296 A1 | 10/2011 | Choi et al. |
| 2012/0211774 A1 | 8/2012 | Harada |
| 2013/0193839 A1 | 8/2013 | Kobayashi |
| 2013/0208442 A1 | 8/2013 | Reiherzer |

(Continued)

FOREIGN PATENT DOCUMENTS

| CN | 106992239 A | 7/2017 |
| JP | 2005-191197 A | 7/2005 |

(Continued)

*Primary Examiner* — Changhyun Yi

(74) *Attorney, Agent, or Firm* — Foley & Lardner LLP

(57) ABSTRACT

A light-emitting device includes: a light-emitting element; a first light-transmissive member located on an upper surface of the light-emitting element and containing substantially no phosphor; a second light-transmissive member located on an upper surface of the first light-transmissive member and containing a first phosphor; and a third light-transmissive member covering an upper surface of the second light-transmissive member and a lateral surface of the light-emitting element and containing a second phosphor. A refractive index of a resin material serving as a base material of the second light-transmissive member is higher than a refractive index of a resin material serving as a base material of the first light-transmissive member. A refractive index of a resin material serving as a base material of the third light-transmissive member is equal to or higher than the refractive index of the resin material serving as the base material of the second light-transmissive member.

20 Claims, 5 Drawing Sheets

(56) References Cited

U.S. PATENT DOCUMENTS

| | | | |
|---|---|---|---|
| 2015/0054011 A1 | 2/2015 | Koizumi et al. | |
| 2016/0093777 A1* | 3/2016 | Sato | H01L 33/504 |
| | | | 257/98 |
| 2016/0149089 A1* | 5/2016 | Yamaguchi | H01L 33/24 |
| | | | 257/98 |
| 2018/0106942 A1 | 4/2018 | Ozeki et al. | |

FOREIGN PATENT DOCUMENTS

| | | | |
|---|---|---|---|
| JP | 2007-027751 | A | 2/2007 |
| JP | 2007-266571 | A | 10/2007 |
| JP | 2008-159707 | A | 7/2008 |
| JP | 2012-169442 | A | 9/2012 |
| JP | 2013-120812 | A | 6/2013 |
| JP | 2013-157397 | A | 8/2013 |
| JP | 2013-175767 | A | 9/2013 |
| JP | 2014-082416 | A | 5/2014 |
| JP | 2015-002298 | A | 1/2015 |
| JP | 2015-015418 | A | 1/2015 |
| JP | 2015-041709 | A | 3/2015 |

\* cited by examiner

LIGHT-EMITTING DEVICE AND METHOD OF MANUFACTURING THE SAME

CROSS-REFERENCE TO RELATED APPLICATION

This application claims priority to Japanese Patent Application No. 2018-105745, filed on Jun. 1, 2018, the disclosure of which is hereby incorporated by reference in its entirety.

BACKGROUND

The present disclosure relates to a light-emitting device.

Japanese Unexamined Patent Publication No. 2013-120812 discloses a light-emitting device in which a second encapsulating material 15 containing a red phosphor is disposed on the upper surface of a near-ultraviolet LED chip 14.

In general, light emitted from excited phosphor particles travels radially from the phosphor particles. Hence, in the light-emitting device in Japanese Patent Publication No. 2013-120812, part of light emitted from particles of the red phosphor returns toward the LED chip 14, and part of the light may be absorbed by the LED chip 14. Accordingly, the light-emitting device in Japanese Patent Publication No. 2013-120812 may exhibit low light extraction efficiency.

SUMMARY

One object of certain embodiments of the present disclosure is to provide a light-emitting device that exhibits improved light extraction efficiency.

According to another embodiment, a light-emitting device includes a light-emitting element, a first light-transmissive member located on an upper surface of the light-emitting element and containing substantially no phosphor, a second light-transmissive member located on an upper surface of the first light-transmissive member and containing a first phosphor, and a third light-transmissive member covering an upper surface of the second light-transmissive member and a lateral surface of the light-emitting element and containing a second phosphor. A refractive index of a resin material serving as a base material of the second light-transmissive member is higher than a refractive index of a resin material serving as a base material of the first light-transmissive member. A refractive index of a resin material serving as a base material of the third light-transmissive member is equal to or higher than the refractive index of the resin material serving as the base material of the second light-transmissive member.

According to another embodiment, a method of manufacturing a light-emitting device includes: providing a light-emitting element; disposing a first light-transmissive member on an upper surface of the light-emitting element, and roughening a surface of the first light-transmissive member; disposing a second light-transmissive member on an upper surface of the first light-transmissive member, and roughening a surface of the second light-transmissive member; and disposing a third light-transmissive member on an upper surface of the second light-transmissive member.

Certain embodiments of the present disclosure can provide a light-emitting device that exhibits improved light extraction efficiency.

DESCRIPTION

Figure 1A:
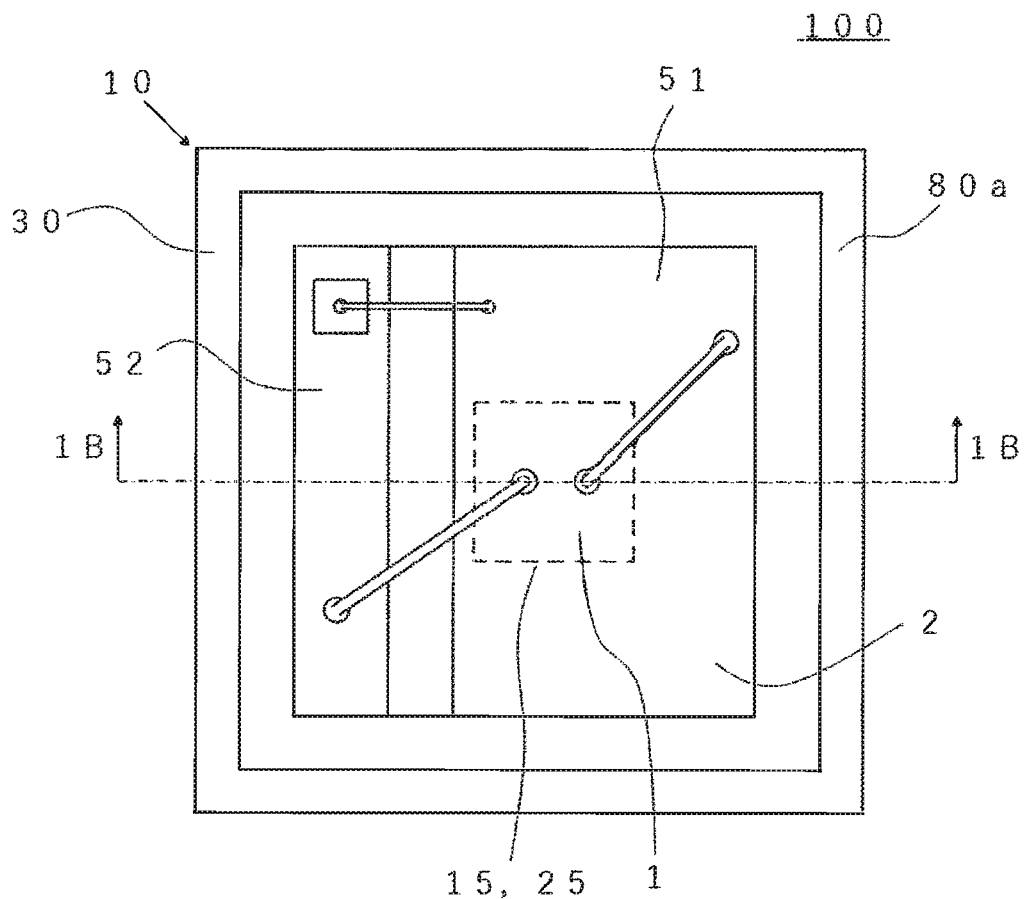
FIG. 1A is a schematic top view of a light-emitting device according to a first embodiment.

Detailed descriptions of embodiments are provided below on the basis of the accompanying drawings. Portions with the same reference numeral in a plurality of drawings represent the same or equivalent portion or member.

The embodiments below are example of a light-emitting device embodying the technical concepts of the present disclosure. However, the present invention is not limited to the embodiments described below. Unless specifically stated otherwise, descriptions of sizes, materials, shapes, and relative positions of constituent components below are not intended to limit the scope of the present disclosure thereto but rather are intended to describe examples thereof. Magnitudes or positional relations of members illustrated in the drawings may be exaggerated in order to facilitate understanding.

In the embodiments described below, terms such as "package" and "substrate" may be used as appropriate to represent members both before and after light-emitting elements, wires, or the like are disposed. The term "resin portion" may be used as appropriate to represent members both before and after singulation.

First Embodiment

Figure 1B:
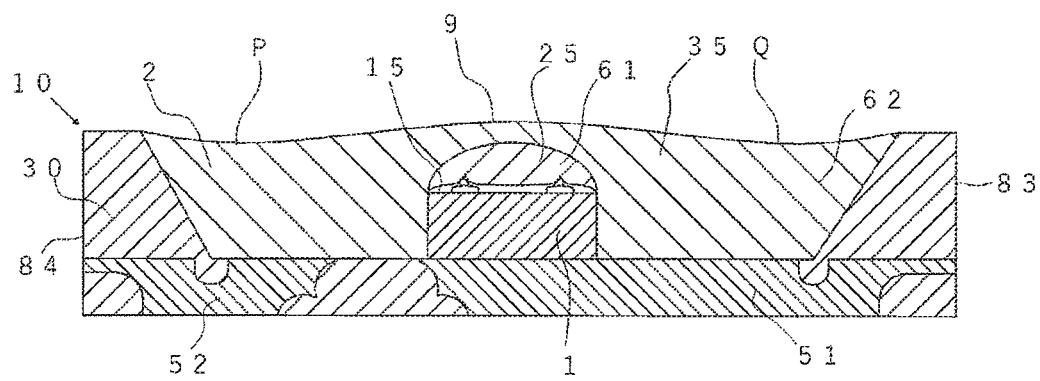
FIG. 1B is a schematic end view taken along the line 1B-1B of FIG. 1A.
Figure 1C:
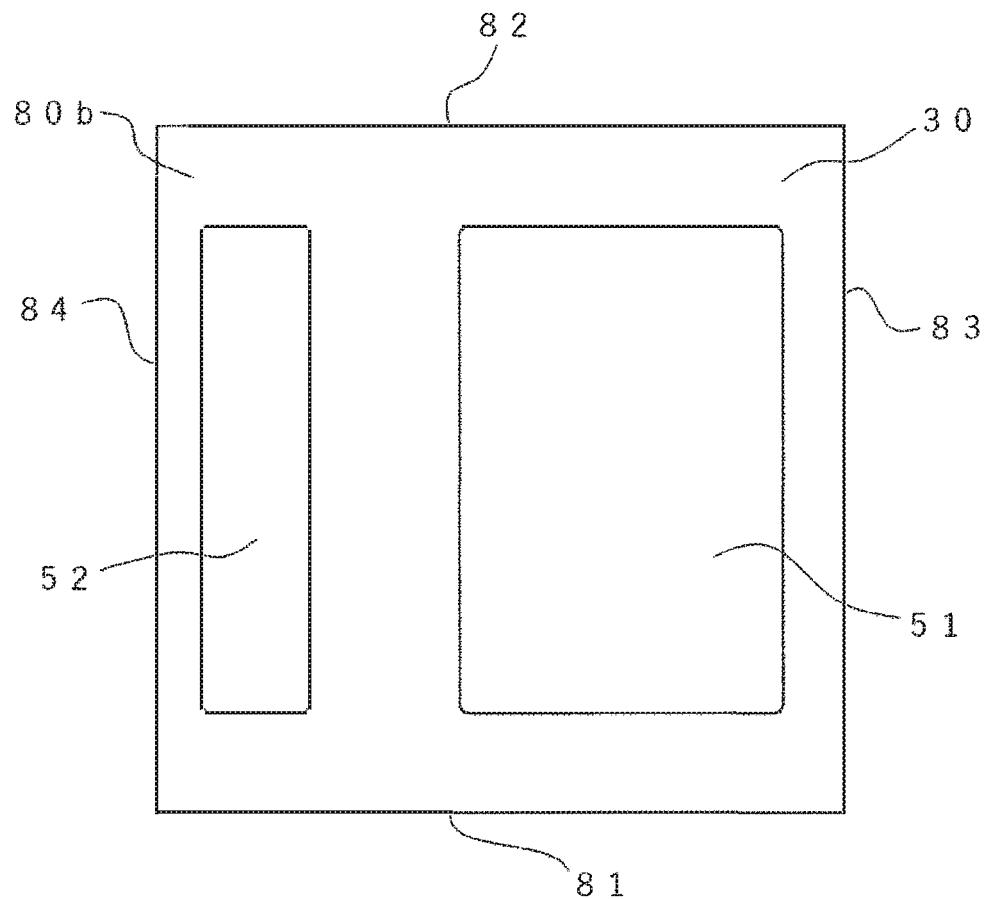
FIG. 1C is a schematic bottom view of the light-emitting device according to the first embodiment.

FIG. 1A is a schematic top view of a light-emitting device 100 according to a first embodiment. FIG. 1B is a schematic end view taken along the line 1B-1B of FIG. 1A. FIG. 1C is a schematic bottom view of the light-emitting device 100 according to the first embodiment. In FIG. 1A, a third light-transmissive member 35 is omitted so that the inside of a recess 2 can be easily understood, and the outer edge of a light-emitting element 1 is indicated by a dashed line because a first light-transmissive member 15 and a second light-transmissive member 25 are located on the upper surface of the light-emitting element 1.

The light-emitting device 100 shown in FIG. 1A and FIG. 1B includes the light-emitting element 1, the first light-transmissive member 15 located on the upper surface of the light-emitting element 1 and containing substantially no phosphor, the second light-transmissive member 25 located on the upper surface of the first light-transmissive member 15 and containing a first phosphor 61, and the third light-transmissive member 35 covering the upper surface of the second light-transmissive member 25 and lateral surfaces of the light-emitting element 1 and containing a second phosphor 62. The light-emitting device 100 according to the first embodiment further includes a package 10 having the recess 2, and the light-emitting element 1 is disposed on the bottom surface of the recess 2.

First Light-Transmissive Member and Second Light-Transmissive Member

The first light-transmissive member 15 is located on the upper surface of the light-emitting element 1 and contains substantially no phosphor. The first light-transmissive member 15 has the function of reflecting light that returns toward the light-emitting element 1 (such as part of light emitted from the first phosphor 61 contained in the second light-transmissive member 25) upward at the interface between the first light-transmissive member 15 and the second light-transmissive member 25. This structure can reduce a possibility that part of light emitted from the light-emitting element 1 returns toward the light-emitting element 1 and is absorbed by the light-emitting element 1. Accordingly, the light extraction efficiency of the light-emitting device 100 can be enhanced. The first light-transmissive member 15 can contain a light-scattering material such as silicon oxide or aluminum oxide.

The first light-transmissive member 15 preferably covers only the upper surface of the light-emitting element 1. In other words, it is preferable that the first light-transmissive member 15 cover the upper surface of the light-emitting element 1 and not cover the lateral surfaces of the light-emitting element 1. With this structure, the second phosphor 62 in the third light-transmissive member 35 described later is disposed near the lateral surfaces of the light-emitting element 1. Hence, in the case in which, for example, the second phosphor 62 is a phosphor with high excitation efficiency, the second phosphor 62 is efficiently excited by light emitted in the lateral surface directions of the light-emitting element 1. The light-emitting device can thus exhibit good light extraction efficiency.

The first light-transmissive member 15 preferably covers 50% or more of the area of the upper surface of the light-emitting element 1, more preferably covers the entire upper surface of the light-emitting element 1. In this structure, the first light-transmissive member 15 covers a large part of the upper surface of the light-emitting element 1, so that the upper surface of the first light-transmissive member 15 can effectively reflect light that returns toward the light-emitting element 1.

The first light-transmissive member 15 preferably has minute surface roughness on its upper surface. This structure can enhance the adhesion between the first light-transmissive member 15 and the second light-transmissive member 25. The minute surface roughness can be formed by, for example, roughening the upper surface of the first light-transmissive member 15 as described later.

The second light-transmissive member 25 is located on the upper surface of the first light-transmissive member 15 and contains the first phosphor 61. The second light-transmissive member 25 can convert part of light emitted from the light-emitting element 1 into light with a different wavelength because the second light-transmissive member 25 contains the first phosphor 61. As the second light-transmissive member 25 is located above the light-emitting element 1, the first phosphor 61 can efficiently absorb a large part of light emitted upward from the light-emitting element 1.

The first phosphor 61 is, for example, a red phosphor that emits red light. It is particularly preferable that the first phosphor 61 be a red phosphor emitting light with a large spectral half-width. This constitution can improve the color rendering properties of the light-emitting device 100. The spectral half-width of the red phosphor is in the range of, for example, 80 nm to 100 nm, preferably 85 nm to 95 nm. Examples of such a first phosphor 61 include a red phosphor having a composition represented by Formula (1) below.

$$(Sr,Ca)AlSiN_3:Eu \qquad (1)$$

Using the red phosphor having the composition represented by Formula (1) as the first phosphor 61 can improve the color rendering properties and the light extraction efficiency of the light-emitting device 100.

The content of the first phosphor 61 is, for example, 15 wt % to 60 wt % of the total weight of the second light-transmissive member 25.

The first phosphor 61 may be a red phosphor that emits red light, but may be, for example, a green phosphor that emits green light or a blue phosphor that emits blue light. The first phosphor 61 may comprise a single type of phosphor or multiple type of phosphors.

The refractive index of a resin material serving as the base material of the second light-transmissive member 25 is higher than the refractive index of a resin material serving as the base material of the first light-transmissive member 15. Hence, light that is emitted from the light-emitting element 1 and travels from the first light-transmissive member 15 to the second light-transmissive member 25 is likely to be transmitted at the interface between the first light-transmissive member 15 and the second light-transmissive member 25. On the other hand, light traveling from the second light-transmissive member 25 to the first light-transmissive member 15, for example, light emitted from the first phosphor 61 in the second light-transmissive member 25 toward the light-emitting element 1, is likely to be reflected at the interface between the first light-transmissive member 15 and the second light-transmissive member 25. The ratio of light that returns toward the light-emitting element 1 can be thus reduced, so that the light extraction efficiency of the light-emitting device 100 can be effectively enhanced.

The difference in refractive index between the resin material serving as the base material of the second light-transmissive member 25 and the resin material serving as the base material of the first light-transmissive member 15 is, for example, 0.02 to 0.3, preferably 0.05 to 0.1. For example, the refractive index of the resin material serving as the base material of the first light-transmissive member 15 is 1.3 to 1.5, and the refractive index of the resin material serving as the base material of the second light-transmissive member 25 is 1.4 to 1.6.

The refractive indices in this case are measured by, for example, the minimum deviation method, the critical angle method, or the V-block method using a refractometer.

For example, a dimethyl silicone resin can be selected as the resin material for the first light-transmissive member 15, and a phenyl silicone resin can be selected as the resin material for the second light-transmissive member 25. With this structure, the difference in refractive index between the resin material serving as the base material of the first light-transmissive member 15 and the resin material serving as the base material of the second light-transmissive member 25 can easily be in a desired range. In addition, as a dimethyl silicone resin is generally more resistant to light than a phenyl silicone resin, disposing the first light-transmissive member 15 containing a dimethyl silicone resin for the base material near the light-emitting element 1 can improve the reliability of the light-emitting device 100.

The second light-transmissive member 25 preferably covers 50% or more of the area of the upper surface of the first light-transmissive member 15, and more preferably covers the entire upper surface of the first light-transmissive member 15. With this structure, the second light-transmissive member 25 covers a large part of the upper surface of the first light-transmissive member 15, so that the upper surface of the first light-transmissive member 15 can effectively reflect light emitted from the first phosphor 61 contained in the second light-transmissive member 25. The second light-transmissive member 25 may cover part of the upper surface and/or the lateral surfaces of the light-emitting element 1, or may include a portion located at a lateral side of the light-emitting element 1. FIG. 1E shows an example in which part of the second light-transmissive member 25 is located at lateral sides of the light-emitting element 1. The second light-transmissive member 25 shown in FIG. 1E covers the first light-transmissive member 15 and is located above and at lateral sides of the light-emitting element 1. As the second light-transmissive member 25 is located above and at lateral sides of the light-emitting element 1, the first phosphor 61 can efficiently absorb not only light emitted from the upper surface of the light-emitting element 1 but also light emitted from the lateral surfaces of the light-emitting element 1.

The maximum thickness of the second light-transmissive member 25 is preferably larger than the maximum thickness of the first light-transmissive member 15 in the height direction, which is a direction perpendicular to the upper surface of the light-emitting element 1. The maximum thickness of the second light-transmissive member 25 here is the maximum thickness out of the thickness between the upper surface of the second light-transmissive member 25 and the upper surface of the first light-transmissive member 15 in the height direction, and the maximum thickness of the first light-transmissive member 15 is the maximum thickness out of the thickness between the upper surface of the first light-transmissive member 15 and the upper surface of the light-emitting element 1 in the height direction. In the height direction, the maximum thickness of the second light-transmissive member 25 is, for example, two to five times as large as the maximum thickness of the first light-transmissive member 15. With this structure, the amount of the first phosphor 61 contained in the second light-transmissive member 25 can be increased while keeping the thickness of the light-emitting device 100 small in the height direction. Accordingly, a small light-emitting device with desired chromaticity can efficiently be provided.

Preferably, the second light-transmissive member 25 does not cover the lateral surfaces of the light-emitting element 1. With this structure, the second phosphor 62 in the third light-transmissive member 35 is disposed near the lateral surfaces of the light-emitting element 1. Hence, in the case in which, for example, the second phosphor 62 is a phosphor with high excitation efficiency, the second phosphor 62 is efficiently excited by light emitted in the lateral surface directions of the light-emitting element 1. The light-emitting device can thus exhibit good light extraction efficiency.

The second light-transmissive member 25 preferably has minute surface roughness on its upper surface. This structure can enhance the adhesion between the second light-transmissive member 25 and the third light-transmissive member 35. The minute surface roughness can be formed by, for example, roughening the upper surface of the second light-transmissive member 25.

The first light-transmissive member 15 and/or the second light-transmissive member 25 may be, for example, members formed by printing, potting, or spraying of resin materials or resin sheets or blocks.

Figure 1D:
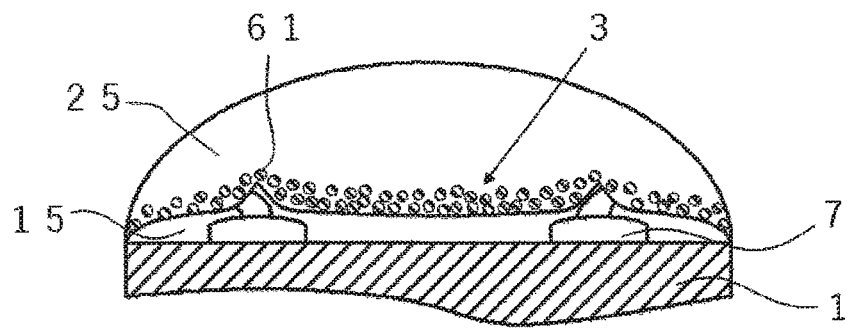
FIG. 1D is a schematic, partial, enlarged view of the vicinity of a first light-transmissive member and a second light-transmissive member in FIG. 1B.
Figure 1E:
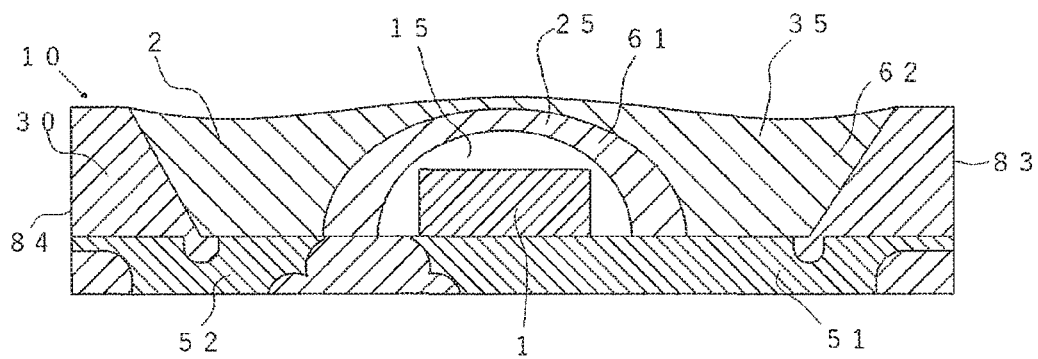
FIG. 1E is a schematic end view of a modification of the light-emitting device according to the first embodiment.

FIG. 1D is a schematic, partial, enlarged view of the vicinity of the first light-transmissive member 15 and the second light-transmissive member 25 in FIG. 1B. FIG. 1D shows an end of each wire connected to the corresponding one of a pair of electrodes on the upper surface of the light-emitting element 1. In FIG. 1B and FIG. 1D, the wires are only partially illustrated because these drawings are schematic end views, but the wires continuously connect the electrodes on the upper surface of the light-emitting element 1 to leads or the like.

Ball portions 7 of the wires are preferably enclosed in the first light-transmissive member 15 as shown in FIG. 1D. In other words, the heights of the ball portions 7 of the wires are preferably located below the upper surface of the first light-transmissive member 15 in the height direction. In this structure, the stress applied on the ball portions 7 of the wires can be reduced by, for example, selecting a resin material with a low hardness for the first light-transmissive member 15, so that wire breakage near the ball portions 7 can be effectively attenuated. For example, a dimethyl silicone resin is selected as the resin material serving as the base material of the first light-transmissive member 15, and a phenyl silicone resin is selected as the resin material serving as the base material of the second light-transmissive member 25. As the hardness of a cured dimethyl silicone resin is generally lower than the hardness of a cured phenyl silicone resin, covering the ball portions 7 of the wires with the first light-transmissive member 15 can effectively attenuate the wire breakage near the ball portions 7. In addition, as a phenyl silicone resin generally has better gas barrier properties than a dimethyl silicone resin, the second light-transmissive member 25 is likely to shut out constituents such as sulfur entering through the opening of the recess 2, thereby reducing a possibility that the constituents such as sulfur reaches the vicinities of the ball portions 7 of the wires. The wire breakage near the ball portions 7 can be thus effectively attenuated. In addition, the surface roughness on the upper surface of the first light-transmissive member 15 as shown in FIG. 1D can enhance the bonding strength between the first light-transmissive member 15 and the second light-transmissive member 25.

The first light-transmissive member 15 preferably has an upper-surface depressed portion 3 on its upper surface as shown in FIG. 1D. The first light-transmissive member 15 having the upper-surface depressed portion 3 allows the first phosphor 61 contained in the second light-transmissive member 25 to easily accumulate in the upper-surface depressed portion 3. Accordingly, light emitted from the light-emitting element 1 can efficiently be absorbed by the first phosphor 61.

The upper surface of the first light-transmissive member 15 preferably has protrusion at regions where the wires pass through and its vicinity. This structure can facilitate formation of the upper-surface depressed portion 3 on the upper surface of the first light-transmissive member 15.

Third Light-Transmissive Member

The third light-transmissive member 35 covers the upper surface of the second light-transmissive member 25 and the lateral surfaces of the light-emitting element 1 and contains the second phosphor 62. The third light-transmissive member 35 has a function of protecting the light-emitting element and other components from external force, dust, and water. The third light-transmissive member 35 may cover the upper surface of the light-emitting element 1.

The refractive index of a resin material serving as the base material of the third light-transmissive member 35 is equal to or higher than the refractive index of the resin material serving as the base material of the second light-transmissive member 25. Hence, light traveling from the second light-transmissive member 25 to the third light-transmissive member 35 is likely to be transmitted at the interface between the second light-transmissive member 25 and the third light-transmissive member 35. On the other hand, light traveling from the third light-transmissive member 35 to the second light-transmissive member 25 is likely to be reflected at the interface between the second light-transmissive member 25 and the third light-transmissive member 35. This structure can effectively enhance the light extraction efficiency of the light-emitting device 100.

The difference in refractive index between the resin material serving as the base material of the third light-transmissive member 35 and the resin material serving as the base material of the second light-transmissive member 25 is, for example, 0 to 0.2. For example, the refractive index of the resin material serving as the base material of the second light-transmissive member 25 is 1.4 to 1.6, and the refractive index of the resin material serving as the base material of the third light-transmissive member 35 is 1.4 to 1.6. The refractive indices in this case are measured by, for example, the minimum deviation method, the critical angle method, or the V-block method using a refractometer.

The third light-transmissive member 35 preferably has a projection 9 on its upper surface above the second light-transmissive member 25 as shown in FIG. 1B. With this structure, light exiting from the second light-transmissive member 25 upward can be efficiently extracted to the outside through the projection 9. As shown in FIG. 1B, the projection 9 is, for example, a portion defined by two points P and Q of inflection at which the curvature of the upper surface of the third light-transmissive member 35 changes.

The second phosphor 62 may comprise a single type of phosphor or multiple type of phosphors. Using a plurality of types of phosphors as the second phosphor 62 can, for example, improve the color rendering properties of the light-emitting device 100. The second phosphor 62 preferably comprises $(Y,Lu,Gd)_3(Al,Ga)_5O_{12}:Ce$, and more preferably comprises a mixture of $(Y,Lu,Gd)_3(Al,Ga)_5O_{12}:Ce$ and $(Sr,Ca)AlSiN_3:Eu$. This can provide a light-emitting device having high color rendering properties.

The second phosphor 62 is preferably a phosphor that emits light with a wavelength equal to the wavelength of light emitted from the first phosphor 61 or a phosphor that emits light with a shorter wavelength than light emitted from the first phosphor 61. In other words, light emitted from the first phosphor 61 preferably has a longer wavelength than the wavelength of light emitted from the second phosphor 62. The ratio of absorption of light emitted from the first phosphor 61 by the second phosphor 62 can be thus reduced.

The third light-transmissive member may be, for example, a member formed by printing, potting, or spraying of a resin material or a resin sheet or block.

Package

The light-emitting device 100 can include the package 10 having the recess 2. The package 10 is a base on or above which the light-emitting element 1 is disposed. The package 10 shown in FIG. 1A and FIG. 1B includes a first lead 51, a second lead 52, and a resin portion 30 supporting the first lead 51 and the second lead 52. The package 10 has the recess 2, and portions of the upper surfaces of the first lead 51 and the second lead 52 serve as the bottom surface of the recess 2.

The package 10 shown in FIG. 1A to FIG. 1C has an upper surface 80a and a lower surface 80b opposite to the upper surface 80a. The package 10 has a substantially square or rectangular external shape in a top view and also has a first outer lateral surface 81, a second outer lateral surface 82 opposite to the first outer lateral surface 81, a third outer lateral surface 83, and a fourth outer lateral surface 84 opposite to the third outer lateral surface 83. The first lead 51 and the second lead 52 preferably do not extend out from the resin portion 30 on the outer lateral surfaces of the package 10 as shown in FIG. 1B. In FIG. 1B, the first lead 51 is exposed from the resin portion 30 and is substantially flush with the resin portion 30 on the third outer lateral surface 83. Also the second lead 52 is exposed from and substantially flush with the resin portion 30 and is substantially flush with the resin portion 30. Similarly, the leads are preferably substantially flush with the resin portion also on the first outer lateral surface 81 and the second outer lateral surface 82. This can provide a small light-emitting device 100 with a small occupation area.

The lower surface 80b of the package 10 functions as a mounting surface used for mounting the light-emitting device 100 on a mounting board. The first lead 51 and the second lead 52 are exposed from the resin portion 30 on the lower surface 80b of the package 10. This structure enables efficient dissipation of heat generated from the light-emitting element 1 through the lower surface 80b of the package 10. The lower surface of the first lead 51, the lower surface of the second lead 52 and the resin portion 30 are substantially flush with one another on the lower surface 80b of the package 10.

Method of Manufacturing Light-Emitting Device according to First Embodiment

A method of manufacturing the light-emitting device 100 according to the first embodiment includes providing the light-emitting element 1, disposing the first light-transmissive member 15 on the upper surface of the light-emitting element 1, disposing the second light-transmissive member 25 on the upper surface of the first light-transmissive member 15, and disposing the third light-transmissive member 35 on the upper surface of the second light-transmissive member 25. The method of manufacturing the light-emitting device 100 according to the first embodiment further includes providing a substrate 200 having a plurality of recesses 2 on its upper surface, and cutting the substrate 200 after disposing the light-emitting elements 1 and other components to provide a plurality of light-emitting devices 100.

Providing Substrate

Figure 2A:
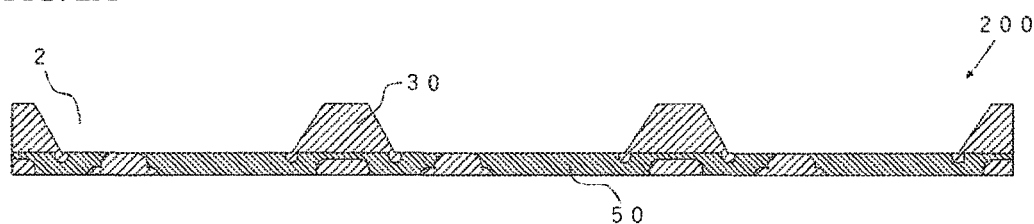
FIG. 2A is a schematic end view showing an illustrative method of manufacturing the light-emitting device according to the first embodiment.

First, the substrate 200 having a plurality of recesses 2 on its upper surface is provided as shown in FIG. 2A. The substrate 200 shown in FIG. 2A includes the resin portion 30 and a lead frame 50 including a plurality of portions that are intended to be the first leads 51 and the second leads 52. Part of the lead frame 50 is exposed from the resin portion 30 on the bottom surfaces of the recesses 2. The substrate 200 can be provided by, for example, disposing the lead frame 50 in a molding die, pouring an uncured resin material (e.g., a mixture comprising a resin material serving as the base material containing a light-reflective substance) into the die, and then curing the resin material. Alternatively, the substrate 200 can be provided by, for example, buying a substrate.

Providing Light-Emitting Element

Figure 2B:
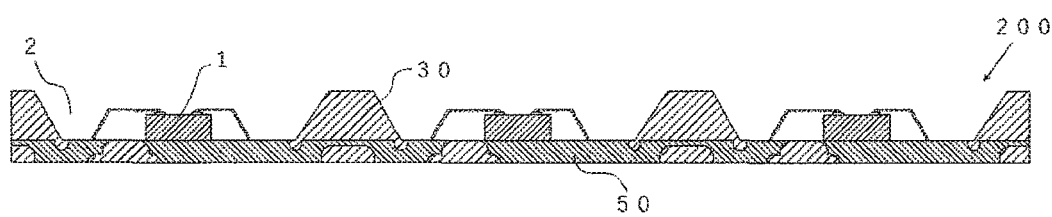
FIG. 2B is a schematic end view showing the illustrative method of manufacturing the light-emitting device according to the first embodiment.

Subsequently, the light-emitting elements 1 are provided. In FIG. 2B, the light-emitting elements 1 are disposed on or above the bottom surfaces of the recesses 2. The light-emitting elements 1 are bonded to the lead frame 50 located on the bottom surfaces of the recesses 2 with die-bonding members such as a silicone resin therebetween. The electrodes on the upper surfaces of the light-emitting elements 1 are connected to the lead frame 50 by wires. In FIG. 2B, portions of the wires extending in the depth direction are indicated by dashed lines so that how the wires connect can be understood. The light-emitting elements 1 may be bonded without wires. For example, the light-emitting elements 1 may be disposed such that positive and negative electrodes formed on one surface of each light-emitting element 1 face the upper surface of the lead frame, and bonded using bonding members such as silver paste, gold bumps, or gold-tin. The light-emitting elements 1 may be provided by manufacturing or buying light-emitting elements.

Disposing First Light-Transmissive Member

Figure 2C:
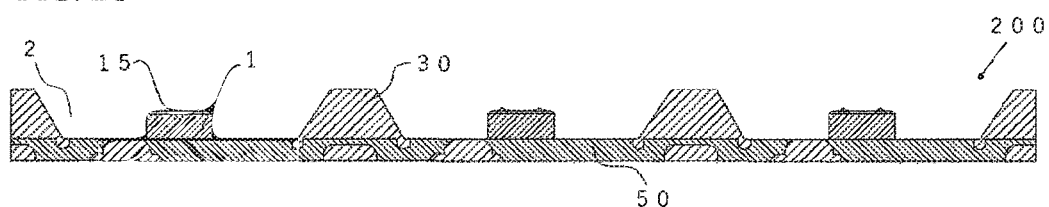
FIG. 2C is a schematic end view showing the illustrative method of manufacturing the light-emitting device according to the first embodiment.

Subsequently, the first light-transmissive members 15 are disposed on the upper surfaces of the light-emitting elements 1 as shown in FIG. 2C. In FIG. 2C and subsequent drawings, wires extending in the depth direction are not shown. The first light-transmissive members 15 are formed by, for example, applying a resin material over the upper surfaces of the light-emitting elements 1 by potting with a dispenser, and curing the resin material. In the case in which the first light-transmissive members 15 are formed by potting, the upper surfaces of the first light-transmissive members 15 are likely to be curved surfaces. This structure can reduce, for example, the ratio that the first light-transmissive member 15 reflects light traveling from the light-emitting element 1 to the first light-transmissive member 15. The upper surface of the first light-transmissive member 15 is not necessarily be curved surface. For example, flat surface or a combination of curved surface and flat surface is possible.

Subsequently, the first light-transmissive members 15 are preferably roughened before disposing the second light-transmissive members 25. Minute surface roughness can be thus formed on the upper surfaces of the first light-transmissive members 15. Accordingly, in the case in which, for example, the second light-transmissive members 25 are formed by application over the upper surfaces of the first light-transmissive members 15, the adhesion between the first light-transmissive members 15 and the second light-transmissive members 25 can be effectively enhanced. Example methods of the roughening include the plasma treatment, etching, abrasive blasting, and depositing fine particles.

In the step of disposing the first light-transmissive members 15, the first light-transmissive members 15 are preferably formed so as to cover the ball portions 7 of the wires connecting the light-emitting elements 1 to the lead frame 50. In this structure, the stress applied on the vicinities of the ball portions 7 of the wires can be reduced by selecting a resin material with a low hardness for the first light-transmissive members 15. Accordingly, the wire breakage near the ball portions 7 of the wires can be effectively attenuated. In this case, the hardness of the first light-transmissive members 15 can be lower than the hardness of the second light-transmissive members.

Disposing Second Light-Transmissive Member

Figure 2D:
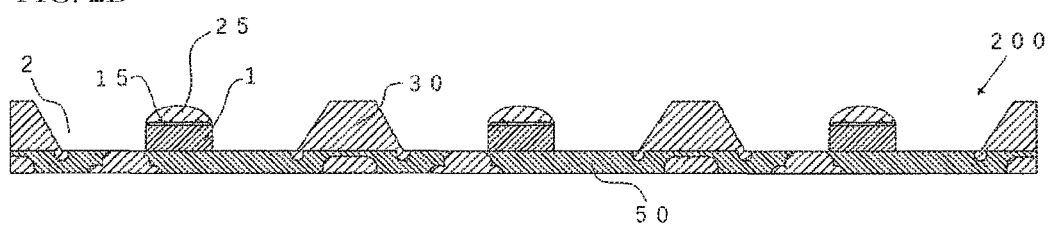
FIG. 2D is a schematic end view showing the illustrative method of manufacturing the light-emitting device according to the first embodiment.

Subsequently, the second light-transmissive members 25 are disposed on the upper surfaces of the first light-transmissive members 15 as shown in FIG. 2D. The second light-transmissive members 25 are formed by, for example, applying a resin material over the upper surfaces of the first light-transmissive members 15 by potting with a dispenser, and curing the resin material. In the case in which the second light-transmissive members 25 are formed by potting, the upper surfaces of the second light-transmissive members 25 are likely to be curved surfaces. This structure can reduce, for example, the ratio that the second light-transmissive member 25 reflects light traveling from the first light-transmissive member 15 to the second light-transmissive member 25. The upper surface of the second light-transmissive member 25 is not necessarily a curved surface. For example, it is possible for the upper surface of the second light-transmissive member 25 to be a flat surface or a combination of a curved surface and a flat surface.

The second light-transmissive members 25 are preferably roughened before disposing the third light-transmissive members 35. Minute surface roughness can be thus formed on the upper surfaces of the second light-transmissive members 25. Accordingly, in the case in which, for example, the third light-transmissive members 35 are formed by application over the upper surfaces of the second light-transmissive members 25, the adhesion between the second light-transmissive members 25 and the third light-transmissive members 35 can be effectively enhanced. Example methods of the roughening include the plasma treatment, etching, abrasive blasting, and depositing fine particles. The second light-transmissive members 25 can be roughened by the same method (e.g., the plasma treatment) as for the first light-transmissive members 15. Settings such as the time and power of the second roughening may be the same as or different from the settings for the first roughening. The depth of the minute surface roughness (i.e., first roughened portions) formed on the first light-transmissive members 15 may be the same as or different from the depth of the minute surface roughness (i.e., second roughened portions) formed on the second light-transmissive members. For example, the depth of the second roughened portions may be greater than the depth of the first roughened portions.

After applying the resin material that constitutes the second light-transmissive members 25, sedimentation is preferably performed. The first phosphor 61 thus accumulates on the surface close to the light-emitting elements 1, and light emitted from the light-emitting elements 1 can be efficiently absorbed by the first phosphor 61.

Disposing Third Light-Transmissive Member

Figure 2E:
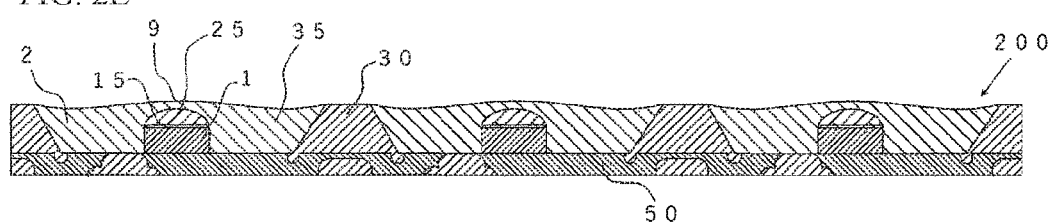
FIG. 2E is a schematic end view showing the illustrative method of manufacturing the light-emitting device according to the first embodiment.

Subsequently, the third light-transmissive members 35 are disposed on the upper surfaces of the second light-transmissive members 25 as shown in FIG. 2E. Each of the third light-transmissive member 35 covers the upper surface of the second light-transmissive member 25 and the lateral surfaces of the light-emitting element 1. The third light-transmissive members 35 are formed by, for example, applying a resin material over the upper surfaces of the second light-transmissive members 25 by potting with a dispenser, and curing the resin material. In the step of disposing each of the third light-transmissive members 35, the upper surface of the third light-transmissive member 35 located above the second light-transmissive member 25 is preferably formed so as to have the projection 9. With this structure, light exiting from the second light-transmissive member 25 upward can be efficiently extracted to the outside through the projection 9. The projections 9 may be formed at the same time as the third light-transmissive members 35 or may be formed in another step after forming the third light-transmissive members 35. In the case in which the projections 9 are formed in another step, the projections 9 can be formed by, for example, applying a resin material at regions located above the second light-transmissive members 25 in the upper surfaces of the third light-transmissive members 35 after forming the third light-transmissive members 35.

Providing Light-Emitting Devices

Figure 2F:
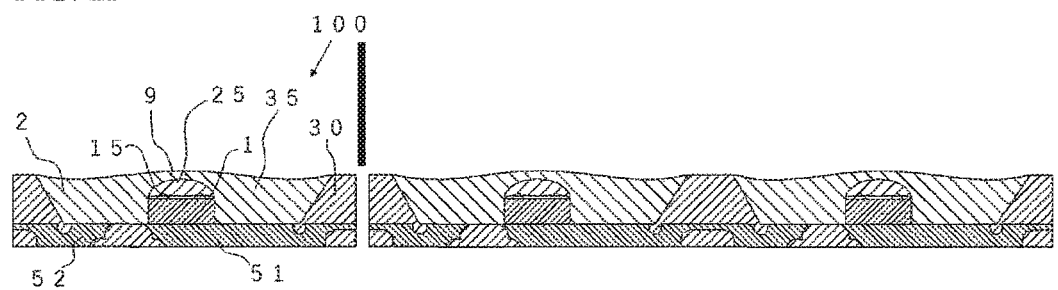
FIG. 2F is a schematic end view showing the illustrative method of manufacturing the light-emitting device according to the first embodiment.

Subsequently, the substrate 200 is cut to provide a plurality of light-emitting devices 100. The substrate 200 can be cut by using, for example, a lead-cutting die, a dicing saw, or laser light. In FIG. 2F, the resin portion 30 and the lead frame 50 are simultaneously cut in the step of cutting the substrate 200. Accordingly, neither the first lead 51 nor the second lead 52 extends out from the resin portion 30 on the outer lateral surfaces of each of the light-emitting devices 100, so that a small light-emitting device can be obtained. The resin portion 30 and the lead frame 50 may be cut in different steps. Depending on the form of the substrate, only the lead frame may be cut. The plurality of light-emitting devices 100 can be obtained through these steps.

Members used for the light-emitting device 100 according to the present disclosure are descried in detail below.

Light-Emitting Element

For the light-emitting element 1, a light-emitting diode element or the like may be used, and a nitride semiconductor ($In_xAl_yGa_{1-x-y}N$, where $0 \leq x$, $0 \leq y$, and $x+y \leq 1$), which can emit visible light, may be suitably used. The light-emitting device 100 must include at least one light-emitting element 1. The number of the light-emitting elements 1 may be determined depending on the purpose and the intended use. The light-emitting element 1 may be mounted with the surface on which the positive and negative electrodes are formed facing up as shown in FIG. 1A, or may be mounted with the surface on which the electrodes are formed facing down.

In the case in which the light-emitting device 100 includes a plurality of light-emitting elements, the employed ones may each be a blue-light emitting element. Alternatively, the plurality of light-emitting elements may be a combination of three light-emitting elements in which a blue-light emitting element, a green-light emitting element, and a red-light emitting element are included, or may be a combination of a blue-light emitting element and a green-light emitting element. In the case in which the light-emitting device 100 includes a plurality of light-emitting elements, the light-emitting elements are electrically connected in series or in parallel, or series connections and parallel connections are combined.

First Light-Transmissive Member, Second Light-Transmissive Member, and Third Light-Transmissive Member For the first light-transmissive member 15, the second light-transmissive member 25, and the third light-transmissive member 35, resin members formed by curing resin materials may be used. Thermosetting resins or thermoplastic resins may be used as the resin materials. Specific examples of the resin materials include epoxy resin compositions, silicone resin compositions, modified epoxy resin compositions such as silicone-modified epoxy resins, modified silicone resin compositions such as epoxy-modified silicone resins, unsaturated polyester resins, saturated polyester resins, polyimide resin compositions, and modified polyimide resin compositions. Other specific examples of the resin materials include resins such as polyphthalamide (PPA), polycarbonate resins, polyphenylene sulfide (PPS), liquid crystal polymers (LCPs), ABS resins, phenolic resins, acrylic resins, and PBT resins. In particular, thermosetting resins, such as silicone resin compositions, having good resistance to heat and light are preferably used as the resin materials for the first light-transmissive member 15, the second light-transmissive member 25, and the third light-transmissive member 35. Preferably, each of the first light-transmissive member 15, the second light-transmissive member 25, and the third light-transmissive member 35 mainly contain silicone resin compositions. This structure can enhance the light resistance of the first to third light-transmissive members, and effectively attenuate degradation by light emitted from the light-emitting element, thereby providing a reliable light-emitting device.

The first light-transmissive member 15, the second light-transmissive member 25, and the third light-transmissive member 35 may contain light-scattering materials. Examples of usable light-scattering materials include titanium oxide, zinc oxide, silicon oxide, zirconium oxide, aluminum oxide, and aluminum nitride.

First Phosphor and Second Phosphor

The second light-transmissive member 25 contains the first phosphor 61, and the third light-transmissive member 35 contains the second phosphor 62. The first phosphor 61 and the second phosphor 62 may each comprise one or more types of phosphors. It is sufficient that the first phosphor 61 and the second phosphor 62 are phosphors that are excited by light emitted from the light-emitting element 1. Examples of the phosphors used as the first phosphor 61 and the second phosphor 62 include $(Ca,Sr,Ba)_5(PO_4)_3(Cl,Br)$:Eu, $(Sr,Ca,Ba)_4Al_{14}O_{25}$:Eu, $(Ca,Sr,Ba)_8MgSi_4O_{16}(F,Cl,Br)_2$:Eu, $(Y,Lu,Gd)_3(Al,Ga)_5O_{12}$:Ce, $(Sr,Ca)AlSiN_3$:Eu, $3.5MgO \cdot 0.5MgF_2 \cdot GeO_2$:Mn, $(x-s)MgO \cdot (s/2)Sc_2O_3 \cdot yMgF_2 \cdot uCaF_2 \cdot (1-t)GeO_2 \cdot (t/2)M^t{}_2O_3$:zMn, $Ca_3Sc_2Si_3O_{12}$:Ce, $CaSc_2O_4$:Ce, $(La,Y)_3Si_6N_{11}$:Ce, $(Ca,Sr,Ba)_3Si_6O_9N_4$:Eu, $(Ca,Sr,Ba)_3Si_6O_{12}N_2$:Eu, $(Ba,Sr,Ca)Si_2O_2N_2$:Eu, $(Ca,Sr,Ba)_2Si_5N_8$:Eu, $(Ca,Sr,Ba)S$:Eu, $(Ba,Sr,Ca)Ga_2S_4$:Eu, $K_2(Si,Ti,Ge)F_6$:Mn, and $Si_{6-z}Al_zO_{8-z}$:Eu $(0<z<4.2)$.

Resin Portion

For the base material of the resin portion 30, a thermosetting resin or a thermoplastic resin can be used. Specific examples of the resin materials include epoxy resin compositions, silicone resin compositions, modified epoxy resin compositions such as silicone-modified epoxy resins, modified silicone resin compositions such as epoxy-modified silicone resins, unsaturated polyester resins, saturated polyester resins, polyimide resin compositions, and modified polyimide resin compositions. Other specific examples of the resin materials include resins such as polyphthalamide (PPA), polycarbonate resins, polyphenylene sulfide (PPS), liquid crystal polymers (LCPs), ABS resins, phenolic resins, acrylic resins, and PBT resins. In particular, a thermosetting resin, such as epoxy resin compositions and silicone resin compositions, having good resistance to heat and light is preferably used as the resin material of the resin portion 30.

It is preferable that the resin portion 30 be a mixture of a light-reflective substance and the resin material serving as the base material. As the light-reflective substance, a member that is less likely to absorb light emitted from the light-emitting element and greatly differs in refractive index from the resin material serving as the base material is preferable. Examples of such a light-reflective substance include titanium oxide, zinc oxide, silicon oxide, zirconium oxide, aluminum oxide, and aluminum nitride.

To improve the contrast of the light-emitting device 100, the resin portion 30 may contain a filler having a low light reflectance with respect to external light (sunlight in many cases) irradiating the light-emitting device 100. In this case, the color of the resin portion 30 is, for example, black or a similar color to black. Examples of the filler include carbon materials such as acetylene black, activated carbon, and graphite; transition metal oxides such as iron oxide, manganese dioxide, cobalt oxide, and molybdenum oxide; and colored organic pigments depending on the purpose.

First Lead and Second Lead

The first lead 51 and the second lead 52 has electrical conductivity and function as electrodes used for supplying electricity to the light-emitting element. Examples of the base material for the first lead 51 and the second lead 52 include metals such as copper, aluminum, gold, silver, iron, nickel, alloys of these metals, phosphor bronze, and copper-iron alloys. A single layer or a layered structure such as a clad material may be employed. It is particularly preferable that copper, which is inexpensive and has high heat dissipation performance, be used as the base material. A silver-containing layer may be disposed on the surfaces of the first lead 51 and the second lead 52. An intermediate layer can be disposed between the base material of the first lead 51 and the second lead 52 and the silver-containing layer. The intermediate layer contains, for example, aluminum, nickel, palladium, rhodium, gold, copper, or an alloy of these metals. The silver-containing layer or the intermediate layer may be disposed on the entire surfaces or part of the surfaces of the first lead 51 and the second lead 52. The silver-containing layer or the intermediate layer formed at the upper surface of each lead may be thicker than the silver-containing layer or the intermediate layer formed at the lower surface of the lead.

A protective layer formed using silicon oxide or the like may be disposed on the outermost surfaces (e.g., the surface of the silver-containing layer) of the first lead 51 and the second lead 52. The protective layer disposed on the surface of the silver-containing layer effectively attenuates progress of deterioration of the silver-containing layer in the case in which, for example, sulfur or the like enters the recess 2. The protective layer can be formed by a vacuum process such as sputtering.

It is sufficient that the package 10 includes at least the first lead 51 and the second lead 52. The package 10 may include three or more leads. For example, the package 10 may include a third lead in addition to the first lead 51 and the second lead 52. The third lead may function as a heat dissipating member or, similarly to the first lead 51 and the like, may function as an electrode.

Second Embodiment

Figure 3A:
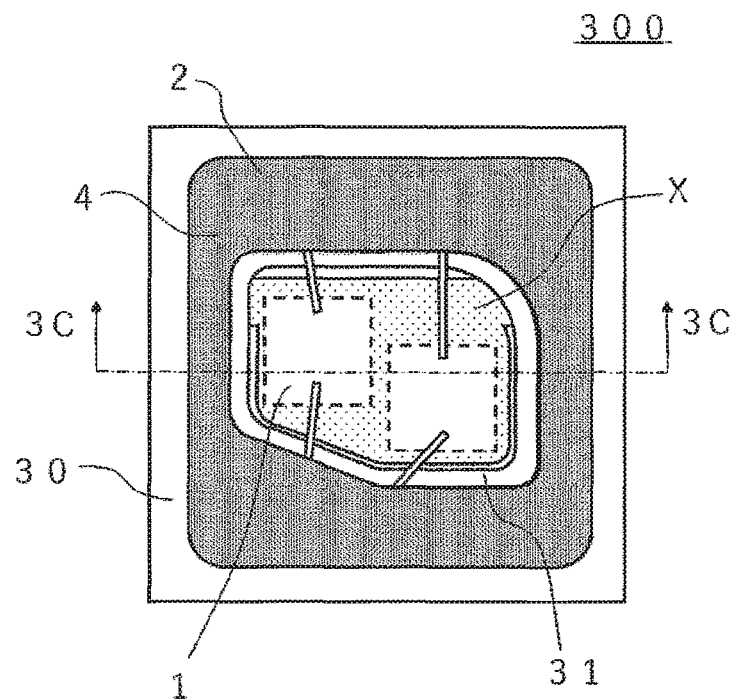
FIG. 3A is a schematic top view of a light-emitting device according to a second embodiment.
Figure 3B:
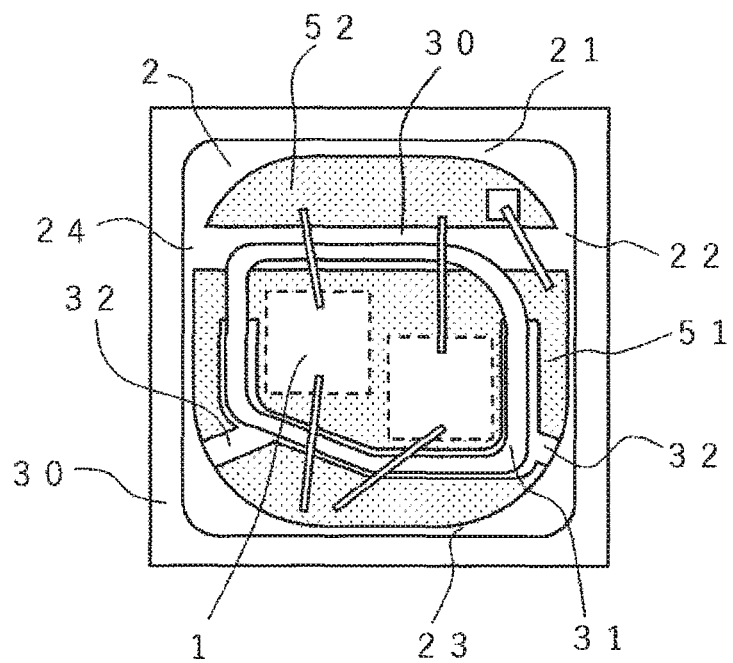
FIG. 3B is a schematic top view of the light-emitting device according to the second embodiment without showing a light-reflective member.
Figure 3C:
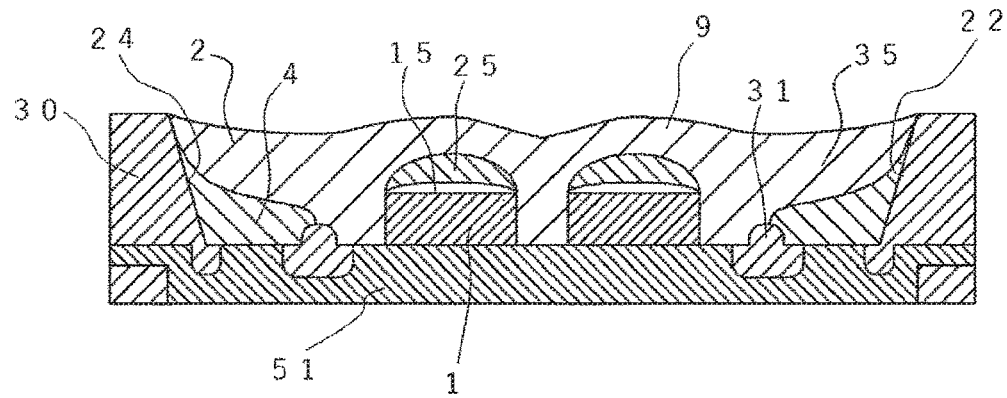
FIG. 3C is a schematic end view taken along the line 3C-3C of FIG. 3A.

FIG. 3A is a schematic top view of a light-emitting device 300 according to a second embodiment. FIG. 3B is a schematic top view of the light-emitting device 300 without showing a light-reflective member 4. FIG. 3C is a schematic end view taken along the line 3C-3C of FIG. 3A. In FIG. 3A and FIG. 3B, the third light-transmissive member 35 is omitted so that the inside of the recess 2 can be easily understood, and the outer edges of the light-emitting elements 1 are indicated by dashed lines because the first light-transmissive members 15 and the second light-transmissive members 25 are located on the upper surfaces of the light-emitting elements 1.

The light-emitting device 300 differs from the light-emitting device 100 of the first embodiment mainly in that a resin frame portion 31 is disposed around a region X in which the light-emitting elements 1 are mounted and in that the light-reflective member 4 is included. Hence, the resin frame portion 31 and the light-reflective member 4 are mainly described below.

The resin frame portion 31 functions as an embankment that prevents a resin material constituting the light-reflective member 4 from covering the lateral surfaces of the light-emitting elements 1. The upper surface of the resin frame portion 31 is located above the upper surfaces of the first lead 51 and the second lead 52 in the height direction. With this structure, the resin frame portion 31 can securely hold back the resin material constituting the light-reflective member 4 when the resin material is poured into the recess 2. The resin frame portion 31 can be formed on the upper surface of the resin portion 30 located between the first lead 51 and the second lead 52 as shown in FIG. 3B. The resin frame portion 31 and the resin portion 30 may constitute an integrated resin member or may be different members.

The light-emitting device 300 preferably includes a resin connecting portion 32 that connects the resin frame portion 31 and the resin portion 30 constituting the lateral walls of the recess 2. This structure can effectively discourage or prevent the resin frame portion 31 from being detached from the upper surface of the lead. The number of resin connecting portions 32 may be one or more.

The light-reflective member 4 has a function of reflecting light emitted from the light-emitting elements 1 toward the opening of the recess 2. The light-reflective member 4 is located in the region defined by (between) lateral surfaces 21, 22, 23, and 24 of the recess 2 and the resin frame portion 31. Specifically, the light-reflective member 4 mainly covers the lateral surfaces 21, 22, 23, and 24, the upper surface of the first lead 51 located outside the resin frame portion 31, and the upper surface of the second lead 52 in the recess 2. The light-reflective member 4 is not formed inside the resin frame portion 31, in other words, in the region X in which the elements are mounted.

The light-reflective member 4 is preferably a member that is less likely to transmit or absorb light emitted from the light-emitting elements and external light. The light-reflective member 4 is preferably white in color. The resin material serving as the matrix of the light-reflective member 4 may be a thermosetting resin or a thermoplastic resin. More specifically, a phenolic resin, an epoxy resin, a BT resin, PPA, a silicone resin, or the like can be used. The light-reflective member 4, may be configured with the resin material matrix containing a light-reflective substance that is less likely to absorb light emitted from the light-emitting elements and greatly differs in refractive index from the resin material matrix. Examples of the light-reflective substance include titanium oxide, zinc oxide, silicon oxide, zirconium oxide, aluminum oxide, and aluminum nitride. With this structure, light emitted from the light-emitting elements can be efficiently reflected. The viscosity of the uncured resin material for the light-reflective member 4 is preferably lower than the viscosity of the uncured resin material for the resin portion 30. For example, the viscosity of the uncured resin material for the light-reflective member is 1 pa·s to 20 pa·s, preferably 5 pa·s to 15 pa·s. With such a viscosity, the light-reflective member 4 can spread well in the recess 2, thereby reducing a possibility that the light-reflective member 4 is insufficiently distributed.

The light-reflective member 4 preferably has a higher light reflectance than the resin portion 30. The content of a light-reflective substance (e.g., titanium oxide) in the light-reflective member 4 is higher than the content of a light-reflective substance in the resin portion 30. Specifically, the content of the light-reflective substance in the light-reflective member 4 is preferably at least 1.5 times, more preferably at least twice, further preferably at least 2.5 times, as large as the content of the light-reflective substance in the resin portion 30. For example, the light-reflective member 4 contains 40 wt % of titanium oxide relative to the total weight of the uncured resin material. The resin portion 30 contains 15 wt % to 20 wt % of titanium oxide relative to the total weight of the uncured resin material.

Third Embodiment

Figure 4A:
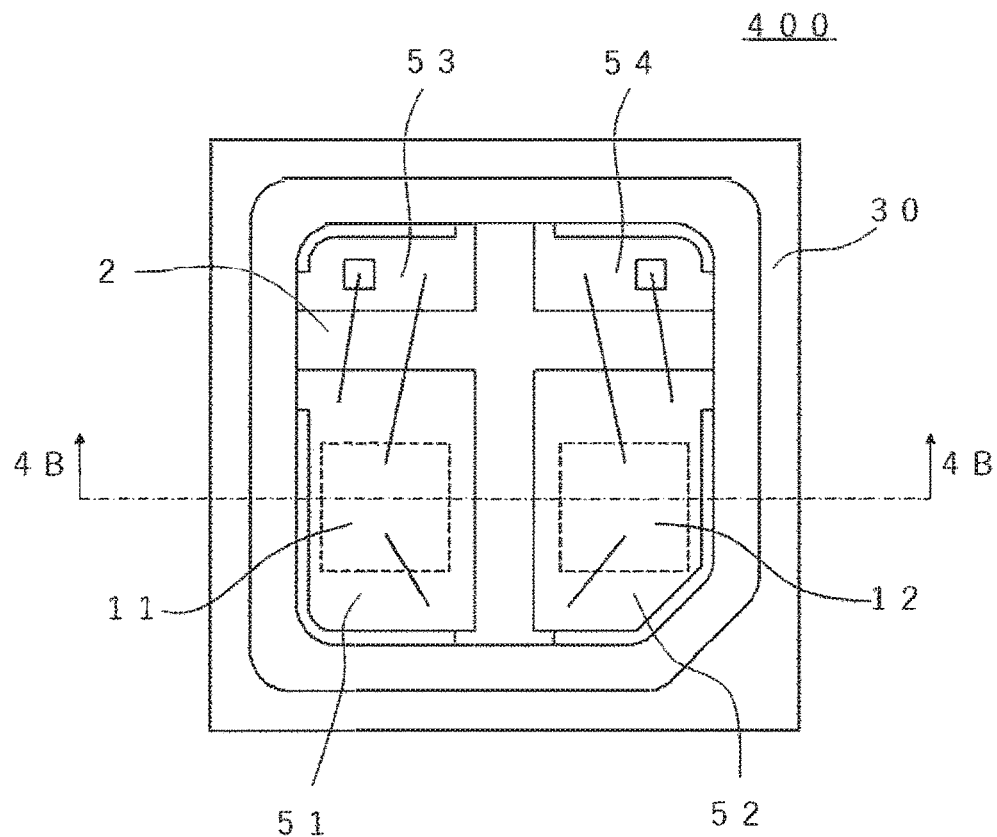
FIG. 4A is a schematic top view of a light-emitting device according to a third embodiment.
Figure 4B:
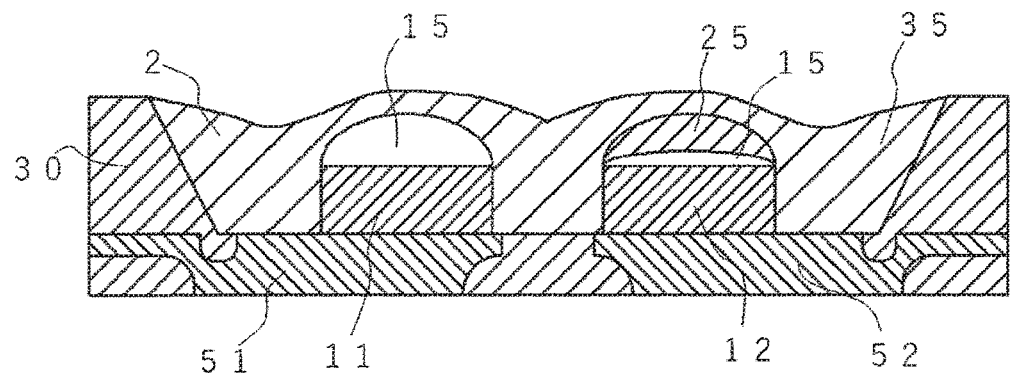
FIG. 4B is a schematic end view taken along the line 4B-4B of FIG. 4A.

FIG. 4A is a schematic top view of a light-emitting device 400 according to a third embodiment. FIG. 4B is a schematic end view taken along the line 4B-4B of FIG. 4A. In FIG. 4A, the third light-transmissive member 35 is omitted so that the inside of the recess 2 can be easily understood, and the outer edges of the light-emitting elements 1 are indicated by dashed lines because the first light-transmissive members 15 and the second light-transmissive member 25 are located on the upper surfaces of the light-emitting elements 1.

The light-emitting device 400 differs from the light-emitting device 100 of the first embodiment mainly in that three or more leads are included and in that a plurality of light-emitting elements are independently driven. Hence, differences from the light-emitting device 100 are mainly described below.

The light-emitting device 400 includes three or more leads and a plurality of light-emitting elements. The light-emitting device 400 shown in FIG. 4A includes a first lead 51, a second lead 52, a third lead 53, a fourth lead 54, a first light-emitting element 11, and a second light-emitting element 12. The first light-emitting element 11 and the second light-emitting element 12 are connected in parallel. This structure enables current values applied to the first light-emitting element 11 and the second light-emitting element 12 to be individually set. For example, the first light-emitting element 11 and the second light-emitting element 12 can be driven at different current values. The light-emitting device 400 can emit light with a desired color by adjusting the emission intensities of the respective light-emitting elements.

In the light-emitting device 400 shown in FIG. 4A, the first light-emitting element 11 is disposed on or above the upper surface of the first lead 51, and the second light-emitting element 12 is disposed on or above the upper surface of the second lead 52. One of the positive and negative electrodes of the first light-emitting element 11 is connected to the first lead 51 by a wire, and the other electrode is connected to the third lead 53 by a wire. One of the positive and negative electrodes of the second light-emitting element 12 is connected to the second lead 52 by a wire, and the other electrode is connected to the fourth lead 54 by a wire. With this structure, the conductive path (i.e., the first lead 51 and the third lead 53) of the first light-emitting element 11 and the conductive path (i.e., the second lead 52 and the fourth lead 54) of the second light-emitting element 12 can be completely separated. Hence, the current value applied to each of the first light-emitting element 11 and the second light-emitting element 12 can be adjusted with a high degree of flexibility.

In the light-emitting device 400 shown in FIG. 4B, a first light-transmissive member 15 is disposed on the upper surface of the first light-emitting element 11, and a first light-transmissive member 15 and a second light-transmissive member 25 are disposed on the upper surface of the second light-emitting element 12. In other words, the second light-transmissive member 25 containing at least one phosphor is disposed on the upper surface of one of the light-emitting elements and is absent on the upper surface of the other light-emitting element. This allows the chromaticity of light emitted upward from one of the light-emitting elements to be different from the chromaticity of light emitted upward from the other light-emitting element. The light-emitting device 400 can thus easily emit light with a desired chromaticity. The second light-transmissive member 25 may be disposed on the upper surface of the first light-emitting element 11. In this case, the first phosphor 61 contained in the second light-transmissive member 25 positioned above the first light-emitting element 11 may be different from the first phosphor 61 contained in the second light-transmissive member 25 positioned above the second light-emitting element 12. Accordingly, the light-emitting device 400 can emit light with a desired chromaticity.

A light-emitting device, such as the light-emitting device 400 shown in FIG. 4B, in which a light-transmissive member (e.g., second light-transmissive member 25) containing at least one phosphor is disposed above one of light-emitting elements and in which a light-transmissive member (e.g., first light-transmissive member 15) containing substantially no phosphor is disposed above the other light-emitting element is preferably manufactured by the following method.

First, the first light-emitting element 11 and the second light-emitting element 12 are provided. Subsequently, the light-transmissive member (e.g., second light-transmissive member 25) containing the phosphor is disposed above the second light-emitting element 12, and sedimentation is then performed. The first phosphor 61 thus accumulates on the surface close to the second light-emitting element 12, and light emitted from the second light-emitting element 12 can be efficiently absorbed by the first phosphor 61.

Subsequently, the light-transmissive member (e.g., first light-transmissive member 15) containing substantially no phosphor is disposed above the first light-emitting element 11, and sedimentation is not performed. Such a method can discourage or prevent inconveniences such as deformation of the light-transmissive member (e.g., first light-transmissive member 15) caused by sedimentation in the case in which the light-transmissive member (e.g., first light-transmissive member 15) located above the first light-emitting element 11 has a low viscosity.

The invention claimed is:

1. A light-emitting device comprising:
    a light-emitting element;
    a first light-transmissive member located on an upper surface of the light-emitting element and containing substantially no phosphor;
    a second light-transmissive member located on an upper surface of the first light-transmissive member and containing a first phosphor, wherein, in a cross-sectional view, at least a portion of an upper surface of the second light-transmissive member is curved, and a thickness of a portion of the second light-transmissive member that is located above a center portion of the light-emitting element is larger than a thickness of a portion of the second light-transmissive member that is located above an outer edge portion of the light-emitting element; and a third light-transmissive member covering the upper surface of the second light-transmissive member and a lateral surface of the light-emitting element and containing a second phosphor;

wherein a refractive index of a resin material serving as a base material of the second light-transmissive member is higher than a refractive index of a resin material serving as a base material of the first light-transmissive member; and wherein a refractive index of a resin material serving as a base material of the third light-transmissive member is equal to or higher than the refractive index of the resin material serving as the base material of the second light-transmissive member.

2. The light-emitting device according to claim 1, wherein the second light-transmissive member covers an entire area of the upper surface of the first light-transmissive member.

3. The light-emitting device according to claim 1, wherein a maximum thickness of the second light-transmissive member is larger than a maximum thickness of the first light-transmissive member in a height direction.

4. The light-emitting device according to claim 1, wherein the lateral surface of the light-emitting element is exposed from the first light-transmissive member and the second light-transmissive member.

5. The light-emitting device according to claim 1, wherein the upper surface of each of the first light-transmissive member and the second light-transmissive member has minute surface roughness.

6. The light-emitting device according to claim 1, wherein light emitted from the first phosphor has a wavelength longer than a wavelength of light emitted from the second phosphor.

7. The light-emitting device according to claim 1, wherein the third light-transmissive member has a projection at its upper surface, the projection being located above the second light-transmissive member.

8. The light-emitting device according to claim 1, wherein the third light-transmissive member contacts the lateral surface of the light-emitting element.

9. The light-emitting device according to claim 1, wherein the first light-transmissive member has a depressed portion in its upper surface.

10. The light-emitting device according to claim 1, wherein, in the cross-sectional view, a thickness of a portion of the first light-transmissive member that is located above the center portion of the light-emitting element is larger than a thickness of a portion of the first light-transmissive member that is located above the outer edge portion of the light-emitting element.

11. The light-emitting device according to claim 1, further comprising:

an additional light-emitting element; and an additional first light-transmissive member located on an upper surface of the additional light-emitting element and containing substantially no phosphor;

wherein the third light-transmissive member contacts an upper surface of the additional first light-transmissive member.

12. The light-emitting device according to claim 1, wherein, in the cross-sectional view, the thickness of the portion of the second light-transmissive member above the center portion of the light-emitting element is at least twice the thickness of the portion of the second light-transmissive member that is located above the outer edge portion of the light-emitting element.

13. The light-emitting device according to claim 1, wherein, in the cross-sectional view, a maximum thickness of the second light-transmissive member is larger than a maximum thickness of the first light-transmissive member, and the third light-transmissive member contacts the lateral surface of the light-emitting element.

14. A method of manufacturing a light-emitting device, comprising:

providing a light-emitting element;

disposing a first light-transmissive member containing substantially no phosphor on an upper surface of the light-emitting element, and roughening a surface of the first light-transmissive member;

disposing a second light-transmissive member containing a first phosphor on an upper surface of the first light-transmissive member, and roughening a surface of the second light-transmissive member, wherein, in a cross-sectional view, at least a portion of an upper surface of the second light-transmissive member is curved, and a thickness of a portion of the second light-transmissive member that is located above a center portion of the light-emitting element is larger than a thickness of a portion of the second light-transmissive member that is located above an outer edge portion of the light-emitting element; and disposing a third light-transmissive member containing a second phosphor on the upper surface of the second light-transmissive member such that the third light-transmissive member covers the upper surface of the second light-transmissive member and a lateral surface of the light-emitting element.

15. The method of manufacturing a light-emitting device according to claim 14, wherein a hardness of the first light-transmissive member is lower than a hardness of the second light-transmissive member.

16. The method of manufacturing a light-emitting device according to claim 14, wherein the third light-transmissive member contacts the lateral surface of the light-emitting element.

17. The method of manufacturing a light-emitting device according to claim 14, wherein the first light-transmissive member has a depressed portion in its upper surface.

18. The method of manufacturing a light-emitting device according to claim 14, wherein, in the cross-sectional view, a thickness of a portion of the first light-transmissive member that is located above the center portion of the light-emitting element is larger than a thickness of a portion of the first light-transmissive member that is located above the outer edge portion of the light-emitting element.

19. The method of manufacturing a light-emitting device according to claim 14, further comprising:

before disposing the third light-transmissive member, providing an additional light-emitting element, and disposing an additional first light-transmissive member containing substantially no phosphor on an upper surface of the additional light-emitting element;

wherein, in the step of disposing the third light-transmissive member, the third light-transmissive member is disposed on an upper surface of the additional first light-transmissive member.

20. The method of manufacturing a light-emitting device according to claim 14, wherein the second light-transmissive member is disposed on the upper surface of the first light-transmissive member such that, in the cross-sectional view, the thickness of the portion of the second light-transmissive member above the center portion of the light-emitting element is at least twice the thickness of the portion of the second light-transmissive member that is located above the outer edge portion of the light-emitting element.

* * * * *